United States Patent [19]

Das

[11] 4,371,608

[45] Feb. 1, 1983

[54] RESIST SYSTEM HAVING INCREASED LIGHT RESPONSE

[75] Inventor: Amitabha Das, Cambridge, Mass.

[73] Assignee: Ionomet Company, Brighton, Mass.

[21] Appl. No.: 275,816

[22] Filed: Jun. 22, 1981

[51] Int. Cl.³ .......................... G03C 5/00; G03C 1/76
[52] U.S. Cl. .................................. 430/315; 156/628; 156/659.1; 156/663; 156/643; 430/313; 430/314; 430/317; 430/323; 430/324; 430/327; 430/328; 430/394; 430/414; 430/416; 430/477; 430/494
[58] Field of Search ............... 430/494, 270, 275, 313, 430/323, 324, 325, 327, 328, 315, 314, 317, 394, 414, 416, 477; 156/628, 635, 662, 663, 643, 659.1

[56] References Cited

U.S. PATENT DOCUMENTS

| | | | |
|---|---|---|---|
| 3,933,496 | 1/1976 | Kolev et al. | 430/414 |
| 4,127,414 | 11/1978 | Yoshikawa et al. | 430/270 |
| 4,269,935 | 5/1981 | Masters et al. | 430/323 |
| 4,276,368 | 6/1981 | Heller et al. | 430/323 |
| 4,316,946 | 2/1982 | Masters et al. | 430/325 |

*Primary Examiner*—Edward C. Kimlin
*Assistant Examiner*—F. K. Wine
*Attorney, Agent, or Firm*—Frank A. Steinhilper

[57] ABSTRACT

A chalcogenide such as $As_2S_3$ is coated on a substrate at a very low rate of deposition in a vacuum evaporator and is coated with a thin silver layer. The silver coated layer is exposed to illumination in a quantity insufficient to form an etchable layer by conventional techniques and the silver is increased by treatment with a silver-containing agent capable of depositing silver on the image, preferably in the presence of radiation. $NaAgSO_3$ is a presently preferred agent. The resulting image-bearing layer is photo-doped by exposure to band-gap radiation and the member is then etched.

8 Claims, No Drawings

RESIST SYSTEM HAVING INCREASED LIGHT RESPONSE

BACKGROUND OF THE INVENTION

In the semiconductor art it is usual to form a photoresist polymer on a suitable substrate which may be a substrate such as glass or the like for the production of a resist mask or may be a semiconductor wafer for the direct production of a polymer pattern on the wafer. Such polymer photo-resists have various problems such as suitable contrast between image areas and non-image areas in the processed resist as well as slower than desired response to light.

Another approach to the manufacture of semiconductor devices employs chalcogenide glasses such as arsenic trisulfide or germanium selenium chalcogenide glasses. Such chalcogenides are also photo-responsive. In addition, recent work with chalcogenides has included a method known as silver photo-doping in which a silver image on the chalcogenide which corresponds to a desired semiconductor device pattern is driven into the chalcogenide, causing it to be selectively etch-resistant. The silver-containing areas on the chalcogenide are etch-resistant, with the result that etching provides a pattern on the substrate permitting production of semiconductor devices through such silver doping techniques.

Both such prior methods require improvement, the most apparent need for improvement being a need for better photo response.

GENERAL NATURE OF THE INVENTION

The present invention includes a chalcogenide resist system having sharply increased response to activating radiation, wherein a chalcogenide layer is formed on a suitable substrate which may be a mask support substrate, the semiconductor wafer itself, or other suitable substrate. In the preferred embodiment of the invention the chalcogenide layer is vacuum evaporated onto the substrate, and the invention includes improved vacuum evaporation of the chalcogenide. In addition, in the preferred embodiment of the invention, use is made of the so-called two layer system in which the chalcogenide is itself placed on a suitable resist layer on the substrate.

After the chalcogenide is formed on the substrate, a weak silver image is formed thereon, the image being insufficient for conventional photo-doping methods. The image is then increased through the deposition of additional silver or silver substance, after which it is driven into the chalcogenide for example by flooding techniques to form a differential etch-resistant pattern. The chalcogenide layer is then etched by known methods to form a pattern corresponding to the desired semiconductor pattern.

According to one procedure for carrying out the present invention, a layer of a chalcogenide such as $As_2S_3$ or a GeSe chalcogenide is vacuum evaporated onto a substrate at a relatively low temperature and at a relatively slow and uniform rate to form a chalcogenide layer of increased response. A silver layer is deposited thereon by chemical reduction of a silver salt onto the chalcogenide or by vacuum evaporation of silver thereon. This silver layer is then exposed to a pattern of activating radiation and the background silver removed, leaving a silver image corresponding to the desired pattern.

The imaged chalcogenide is treated with an oxidizing or metallic salt solution such as, for example, a solution of potassium dichromate. It is then treated with a silver-containing agent capable of depositing silver or silver sulfide on the image areas. A solution of $NaAgSO_3$ in the presence of activating radiation is the presently preferred agent. This image, now containing additional silver, is exposed to suitable radiation such as collimated band-gap radiation to drive the silver into the chalcogenide to form etch-resistant chalcogenide areas corresponding to the silver areas.

SPECIFIC DESCRIPTION OF THE INVENTION

The nature of the invention is best illustrated in conjunction with a specific Example setting forth a presently preferred procedure for carrying out the invention.

EXAMPLE 1

A chalcogenide pattern is placed on a semiconductor wafer according to the following procedure. A polymer resist layer is placed on a semiconductor wafer surface by conventional procedures, using a thin layer of Hunt Waycoat IC 43 Negative Resist which is spun onto the wafer surface and baked at about 200° C. for half an hour. The resist-coated wafer is placed in a vacuum evaporator and preliminarily de-gassed by evacuating the evaporator to a pressure of about $4 \times 10^{-6}$ Torr and holding the pressure at that level for about ten minutes.

A molybdenum boat containing arsenic trisulfide is positioned in the evaporator about one foot from the position of the wafer. The boat temperature is slowly raised to a temperature of about 350° C., the temperature being monitored by the rate of evaporation. Arsenic trisulfide is evaporated onto the wafer surface at a steady rate of about 1 Å per second to form a layer about 3000 Å thick. After the desired layer of arsenic trisulfide is deposited, the pressure is released and the coated wafer is removed from the evaporator.

The chalcogenide-coated wafer is then coated with a layer of metallic silver; in this case a layer of silver is formed on the wafer by dipping it for 2 or 3 minutes in a solution of $NaAgSO_3$ of the same composition as that of the developing solution described hereinafter.

The wafer, now coated with chalcogenide and silver on the polymer resist surface is then exposed to a pattern of activating radiation, employing about 5 milliJoules/cm$^2$ as a measure of exposure of the image areas, compared with an exposure level of about 500 to 1000 milliJoules/cm$^2$ which is a conventional exposure level for such an element. Background silver is then removed with a first bath of $K_3Fe(CN)_6$ plus KBr, which converts the background silver to AgBr, followed by a photographic fixer and a dip in concentrated HCl.

The wafer at this point in the process contains a weak pattern of silver on or in the chalcogenide layer, the pattern being insufficient to provide a chalcogenide/silver image for subsequent etching by standard etching techniques.

A developing solution is made up as follows: $K_2S_2O_5$, 2 grams; $Na_2SO_3$, 8 grams; $AgNO_3$, 2 grams; water, 400 grams.

A desensitizing solution is made up as follows: 0.1 M $K_2Cr_2O_7$ adjusted to pH about 6.0 to 6.5 by addition of NaOH.

The wafer is immersed in the desensitizing solution for 10 minutes at room temperature, rinsed in water, and immersed promptly in the developing solution for two minutes while being flooded with radiation from a infrared lamp about one foot above the developing solution. The wafer is rinsed in water, after which it is placed under a collimated marcury lamp beam for a period of about 5 minutes. After this treatment the wafer is ready for etching. It is then inserted in a Tegal Plasma etcher with a $CF_4$ flow adequate to provide a plasma with about 100 watts of rf energy. The wafer is fully etched in about 2 or 3 minutes to provide a high quality negative relief image.

The chalcogenide for this invention may be arsenic trisulfide or germainium-selenium or other glassy chalcogenide as desired. In general, arsenic trisulfide, $As_2S_3$ is more commonly employed in the semiconductor art. The coating of this chalcogenide on the substrate is carried out slowly, at a steady rate, and at a low temperature. It has been found that coating at a rate of about 1 Å per second to about 2 Å per second is satisfactory. In the procedures described herein with arsenic trisulfide the coating operation is carried out by vacuum evaporation from an inert boat such as a molybdenum boat with a boat temperature of about 350° C., and different temperatures, of course, are used with other chalcogenides. Heat is supplied slowly and steadily to the boat, and evaporation speed is monitored by controlling the evaporation rate of the chalcogenide which in turn is controlled by the amount of heat supplied to the boat. Coating procedures are a significant factor in the sharply increased radiation response of the new system.

Alternatively, useful chalcogenide layers can be formed by other techniques such as chemical deposition and the like.

In the past, procedures generally known as photodoping have formed on a chalcogenide layer a silver image corresponding to a pattern as desired, and the silver has been driven into the chalcogenide by exposure to band-gap radiation or higher energy radiation such as visible light or ultra violet radiation. The term "band-gap radiation" as used here is well understood in the art to denote activating radiation of suitable type or wave length to activate the material being treated. For silver doping of an arsenic trisulfide chalcogenide with a silver deposit on or near the surface thereof, band-gap radiation denotes a wave length less than about ½ micron.

According to the present invention, a silver image for photo-doping is formed on a chalcogenide surface and is then driven into the body in suitable ways such as, for example, as are illustrated in the following steps set forth in the above Example. As a first step, according to the Example, a layer of silver is placed on the chalcogenide. Various procedures for placing a silver layer on the chalcogenide are well known in the art and include both chemical reduction of silver from a solution of a silver salt onto the surface and vacuum evaporation. The presently preferred procedure is deposition from a solution of a silver salt.

The silvered chalcogenide element is then exposed in a suitable manner to a pattern which is to be replicated in the final product. This pattern in the semiconductor art may be a semiconductor circuit or other semiconductor element as desired; it may, for other arts, be any useful or decorative pattern as desired. According to previously known methods, exposure of a silver layer on a chalcogenide has an energy requirement in the order of 500 to 1000 milliJoules per square centimeter in order to achieve a useful photo-doping result. By contrast, according to the present invention, useful photo-doping results are achieved through exposure of a silvered chalcogenide layer with an exposure of about 1 to 5 milliJoules per square centimeter. The exposure can be conventional exposure to visible light, to electron beam writing or to other band-gap radiation. Where extremely fine resolution is required, as in present semiconductor manufacturing operations, electron beam writing has been found to produce extremely fine resolution in the order of a wave length of light.

After exposure, the excess silver or background silver is removed by suitable means. For example, the procedure shown in the above Example or other procedures may be employed.

Treatment of the silver-chalcogenide image is carried out with a silver-containing agent capable of depositing additional silver on the image areas. One such agent is $NaAgSO_3$ as illustrated in the Example, and another is $NaAg(NO_2)_2$. $NaAgSO_3$ and others of these agent act also to deposit silver or give a silver reaction with certain chalcogenides, including arsenic trisulfide, and in such case a two step process is carried out. As the first step, the imaged chalcogenide is treated with a suitable oxidizing agent or metallic salt such as, for example potassium dichromate. The potassium dichromate is preferably prepared in aqueous solution and adjusted to a higher pH slightly short of an alkaline pH, inasmuch as the chalcogenide may be deleteriously affected by alkaline conditions. Chromate as well as dichromate ions exist in the solution, and the chromate ions are favored by the higher pH. What is now thought to happen is that the ions, either chromate or dichromate, fill or neutralize reaction points on the chalcogenide surface and at least temporarily prevent its reaction with the silver solution. Instead of $K_2Cr_2O_7$ there may be used other agents including other chromates as well as permanganates, thiocyanates and metallic salts whose reaction products with sulfur are insoluble, such metallic salts including copper nitrate and the like.

Promptly after the treatment with the potassium dichromate or like agent, the imaged chalcogenide is placed in contact with the silver-depositing agent. As shown in the Example, it is simultaneously exposed to radiation such as, for example, infra-red radiation. Radiation other than infra-red is also suitable, and generally it is desired to employ a wave length less than about one micron. In the presently preferred embodiment of the invention the silver-depositing agent is $NaAgSO_3$ and in the presence of infrared illumination the deposition of silver is carried out in less than about 5 minutes and, as shown in the Example, usually in about one or two minutes. In the absence of infra-red radiation or similar radiation, using $NaAgSO_3$ deposition is extremely slow and may require one or several hours. Another excellent silver-depositing agent is $NaAg(NO_2)_2$. Other silver agents have been found to deposit silver on the imaged chalcogenide, but not as satisfactorily as the preferred agents.

It is believed that the silver in the imaged chalcogenide prior to the treatment with the silver depositing agent is in the form of silver sulfide or a silver complex. It is believed that the silver-depositing agent acts to deposit additional silver on the sulfide and after this deposition begins, the agent then deposits silver on this silver deposit. Many silver-containing agents deposit silver on existing silver deposits, but do not deposit the additional silver on an image of silver sulfide or a silver complex.

Particularly where extremely fine resolution is desired, as in the semiconductor art, the silver deposited on the imaged chalcogenide should be in extremely fine form and not in larger crystal or agglomerate form. The preferred agent, $NaAgSO_3$ deposits an extremely fine silver deposit, and is very suitable for resolutions in the order of a wave length of light or a fraction of a wave length.

After this deposition of silver imaging material from the sulfite or other bath, the strongly imaged chalcogenide is treated to drive the silver in the image areas into the chalcogenide body. As shown in the above Example, this can be accomplished by visible light. Where one is dealing with extremely fine patterns requiring extremely fine resolution, for example resolution in the order of the wave length of light, collimated radiation is preferred, as it drives the silver more directly downward into the chalcogenide. A mercury vapor lamp is highly satisfactory, or other radiation of band-gap or shorter wave length. The silver may be driven into the chalcogenide by heat or infra-red radiation where such fineness of line is not required.

After silver doping, or driving the silver into the chalcogenide, the element is etched in a known manner, for example by means of an alkaline etch, a plasma etch or the like, forming a negative chalcogenide pattern on the substrate. This pattern is then ready for further use as desired. In particular, where a polymer resist layer on a semiconductor wafer underlies the chalcogenide, an oxygen plasma etch forms a resist pattern on the semiconductor wafer for further processing in semiconductor manufacture.

I claim:

1. A process of microlithography for preparing an element useful in the production of semiconductor devices comprising
    coating a thin layer of silver on a chalcogenide surface on a semiconductor element substrate,
    exposing the silver-coated chalcogenide layer to activating radiation in a pattern corresponding to the desired semiconductor device pattern on the substrate in a radiation time and intensity of about 5 milliJoules per square centimeter to form a weak silver image insufficient to form a fully etchable chalcogenide,
    removing silver from the background areas of the chalcogenide surface,
    treating the chalcogenide surface with a desensitizing agent to neutralize the chalcogenide surface against the subsequent silver deposition thereon from a silver-containing agent,
    intensifying the silver image pattern on the chalcogenide with an intensifying agent containing depositable silver to deposit additional silver material on the silver image areas on the chalcogenide, and
    driving the silver image into the chalcogenide by suitable radiation to form an etch resistant cap on the chalcogenide in the image areas, whereby there is formed an etchable image on the chalcogenide surface corresponding to a desired semiconductor device pattern.

2. The process of claim 1, wherein the step of intensifying the silver image is carried out in the presence of radiation less than about one micron wave length.

3. The process of claim 1, wherein the intensifying agent is $NaAgSO_3$.

4. The process of claim 1, wherein the intensifying agent is $NaAg(NO_2)_2$.

5. The process of claim 1, wherein the thin silver layer on the chalcogenide is formed thereon by chemical reduction of a silver salt.

6. The process of claim 1, wherein the background, non-image areas are neutralized by immersing the surface in a solution of potassium dichromate.

7. The process of claim 1, wherein the chalcogenide is $As_2S_3$.

8. In a process of preparing a photo-doped chalcogenide layer on a substrate for the manufacture of semiconductor devices, the steps comprising
    coating a thin layer of silver on a chalcogenide surface on a semiconductor wafer,
    exposing the silver layer to activating radiation in a pattern corresponding to a desired semiconductor device pattern to form a weak silver image insufficient to form a fully etchable chalcogenide,
    desensitizing the background, non-image areas to neutralize the chalcogenide surface against subsequent deposition thereon from a silver-containing agent,
    intensifying the silver image in the exposed image areas by treating the layer with an intensifying agent containing depositable silver to deposit additional silver material on the silver-containing image areas to form an image of increased silver, and
    driving the silver image into the chalcogenide by suitable radiation to form an etch-resistant cap on the chalcogenide in the image areas.

* * * * *